(12) United States Patent
Takata (10) Patent No.: US 9,154,113 B2
(45) Date of Patent: Oct. 6, 2015

(54) LADDER ACOUSTIC WAVE FILTER DEVICE AND BRANCHING FILTER

(71) Applicant: Murata Manufacturing Co., Ltd., Nagaokakyo-shi, Kyoto-fu (JP)

(72) Inventor: Toshiaki Takata, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 360 days.

(21) Appl. No.: 13/686,940

(22) Filed: Nov. 28, 2012

(65) Prior Publication Data

US 2013/0088305 A1    Apr. 11, 2013

Related U.S. Application Data

(63) Continuation of application No. PCT/JP2011/054721, filed on Mar. 2, 2011.

(30) Foreign Application Priority Data

Jun. 22, 2010    (JP) .................................. 2010-141337

(51) Int. Cl.
*H03H 9/64*    (2006.01)
*H03H 9/145*    (2006.01)

(52) U.S. Cl.
CPC ............... *H03H 9/64* (2013.01); *H03H 9/6483* (2013.01); *H03H 9/1452* (2013.01); *H03H 9/14573* (2013.01)

(58) Field of Classification Search
CPC ..... H03H 9/64; H03H 9/6483; H03H 9/1452; H03H 9/14573
USPC ........................ 333/133, 193–196; 310/313 C
See application file for complete search history.

(56) References Cited

U.S. PATENT DOCUMENTS 5,635,883 A * 6/1997 Penunuri et al. ............... 333/195
6,025,763 A * 2/2000 Morimoto ..................... 333/195

(Continued)

FOREIGN PATENT DOCUMENTS

CN    1518217 A    8/2004
JP    09-246911 A    9/1997

(Continued)

OTHER PUBLICATIONS

Official Communication issued in International Patent Application No. PCT/JP2011/054721, mailed on Apr. 19, 2011.

(Continued)

*Primary Examiner* — Robert Pascal
*Assistant Examiner* — Albens Dieujuste
(74) *Attorney, Agent, or Firm* — Keating & Bennett, LLP (57) ABSTRACT

A ladder acoustic wave filter device is constructed such that ripples in the pass band are suppressed, and insertion loss is small in both of a high frequency side portion and a low frequency side portion of the pass band. Apodization weighting is applied to a series-arm-side IDT electrode. Busbars of the series-arm-side IDT electrode are configured so that in an acoustic wave propagation direction, a distance in an overlap width direction between the busbars becomes shorter as the overlap width of electrode fingers becomes smaller. Each of a pair of comb-shaped electrodes of a parallel-arm-side IDT electrode further includes a plurality of dummy electrodes that extend from a busbar and are opposed to electrode fingers of the other comb-shaped electrode in the overlap width direction. The parallel-arm-side IDT electrode is a normal IDT electrode in which the overlap width is constant.

19 Claims, 11 Drawing Sheets

(56) References Cited

U.S. PATENT DOCUMENTS

| | | | |
|---|---|---|---|
| 6,946,931 B2* | 9/2005 | Inoue et al. | 333/195 |
| 7,915,976 B2* | 3/2011 | Tanaka | 333/195 |
| 2001/0011932 A1 | 8/2001 | Takamiya et al. | |
| 2002/0044497 A1 | 4/2002 | Kachi et al. | |
| 2004/0135653 A1 | 7/2004 | Kidoh | |

FOREIGN PATENT DOCUMENTS

| | | |
|---|---|---|
| JP | 10-247835 A | 9/1998 |
| JP | 2001-298348 A | 10/2001 |
| JP | 2002-084162 A | 3/2002 |
| JP | 2007-019975 A | 1/2007 |
| JP | 2008-022296 A | 1/2008 |
| JP | 2008-078885 A | 4/2008 |
| JP | 2010-016523 A | 1/2010 |

OTHER PUBLICATIONS

Official Communication issued in corresponding Chinese Patent Application No. 201180026195.1, mailed on Jun. 27, 2014.
Official Communication issued in corresponding Japanese Patent Application No. 2011-539819, mailed on Feb. 26, 2013.

* cited by examiner

LADDER ACOUSTIC WAVE FILTER DEVICE AND BRANCHING FILTER

BACKGROUND OF THE INVENTION

1. Field of the Invention

The present invention relates to a ladder acoustic wave filter device, and a branching filter including the ladder acoustic wave filter device.

2. Description of the Related Art

In related art, as filter devices for use in communication equipment such as a mobile telephone, acoustic wave filter devices using acoustic waves are used. Acoustic wave filter devices include a longitudinally coupled resonator-type acoustic wave filter device, a ladder acoustic filter device, and so on. For example, a longitudinally coupled resonator-type acoustic wave filter device is preferably used as a receiving filter device in communication equipment which is required to be of a balanced type. On the other hand, a ladder acoustic wave filter device is preferably used as a transmitting filter device that is required to have high electric power handling capability.

For example, according to Japanese Unexamined Patent Application Publication No. 9-246911 mentioned below, in such a ladder acoustic wave filter device, apodization weighting is applied to an IDT electrode forming a series arm resonator. An IDT electrode forming a parallel arm resonator is configured as a normal IDT electrode. In Japanese Unexamined Patent Application Publication No. 9-246911, it is described that signal transmission characteristics can be improved by adopting the above-mentioned configuration.

In the ladder acoustic wave filter device described in Japanese Unexamined Patent Application Publication No. 9-246911 mentioned above, ripples occurring in the high frequency side portion of the pass band can be suppressed by applying apodization weighting to the IDT electrode forming the series arm resonator. However, there is a problem in that it is difficult to sufficiently suppress ripples in the middle portion of the pass band. Moreover, there is a problem in that insertion loss in the lower frequency side portion of the pass band deteriorates.

SUMMARY OF THE INVENTION

Preferred embodiments of the present invention provide a ladder acoustic wave filter device in which ripples in the pass band are suppressed, and insertion loss is small in both of the low frequency side portion and high frequency side portion of the pass band.

A ladder acoustic wave filter device according to a preferred embodiment of the present invention includes an input end, an output end, a series arm, a series arm resonator, a parallel arm, and a parallel arm resonator. The series arm electrically connects the input end and the output end. The series arm resonator is provided to the series arm. The series arm resonator includes a series-arm-side IDT electrode. The parallel arm is electrically connected between the series arm and a ground potential. The parallel arm resonator is provided to the parallel arm. The parallel arm resonator includes a parallel-arm-side IDT electrode. Each of the series-arm-side IDT electrode and the parallel-arm-side IDT electrode includes a pair of comb-shaped electrodes that are interposed between each other. The comb-shaped electrodes each include a busbar and a plurality of electrode fingers extending from the busbar. Apodization weighting is applied to the series-arm-side IDT electrode. The busbars of the series-arm-side IDT electrode are configured so that in an acoustic wave propagation direction, a distance between the busbars in an overlap width direction perpendicular to the acoustic wave propagation direction becomes shorter as an overlap width of the electrode fingers becomes smaller. Each of the pair of comb-shaped electrodes of the parallel-arm-side IDT electrode further includes a plurality of dummy electrodes. Each of the plurality of dummy electrodes extends from the busbar. Each of the plurality of dummy electrodes is opposed to each of the electrode fingers of the other comb-shaped electrode in the overlap width direction. The parallel-arm-side IDT electrode is a normal IDT electrode in which the overlap width is constant.

In a specific aspect of the ladder acoustic wave filter device according to a preferred embodiment of the present invention, in the busbar of each of the pair of comb-shaped electrodes of the series-arm-side IDT electrode, at least a portion of an edge of the busbar which is opposed to the other busbar extends in a direction inclined with respect to the acoustic wave propagation direction.

In another specific aspect of the ladder acoustic wave filter device according to a preferred embodiment of the present invention, the ladder acoustic wave filter device preferably includes a plurality of the series arm resonators. The apodization weighting is applied to the series-arm-side IDT electrode in at least a series arm resonator with a lowest resonant frequency among the plurality of series arm resonators, and the busbars of the pair of comb-shaped electrodes of the series-arm-side IDT electrode are configured so that in the acoustic wave propagation direction, the distance between the busbars in the overlap width direction perpendicular to the acoustic wave propagation direction becomes shorter as the overlap width of the electrode fingers becomes smaller.

In a different specific aspect of the ladder acoustic wave filter device according to a preferred embodiment of the present invention, the apodization weighting is applied to the series-arm-side IDT electrode in all of the plurality of series arm resonators, and the busbars of the pair of comb-shaped electrodes of the series-arm-side IDT electrode are configured so that in the acoustic wave propagation direction, the distance between the busbars in the overlap width direction perpendicular to the acoustic wave propagation direction becomes shorter as the overlap width of the electrode fingers becomes smaller. According to this configuration, insertion loss in the high frequency side portion of the pass band can be reduced more effectively, and ripples occurring in the pass band can be suppressed more effectively.

In still another specific aspect of the ladder acoustic wave filter device according to a preferred embodiment of the present invention, the ladder acoustic wave filter device includes a plurality of the parallel arm resonators. In all of the plurality of parallel arm resonators, each of the pair of comb-shaped electrodes of the parallel-arm-side IDT electrode includes the busbar, the plurality of electrode fingers, and the plurality of dummy electrodes. According to this configuration, insertion loss in the low frequency side portion of the pass band can be reduced more effectively.

In a still different specific aspect of the ladder acoustic wave filter device according to a preferred embodiment of the present invention, a region bounded by a first envelope and a second envelope has a hexagonal shape, the first envelope being an imaginary line formed by connecting tips of the electrode fingers of one of the pair of comb-shaped electrodes of the series-arm-side IDT electrode, the second envelope being an imaginary line formed by connecting tips of the electrode fingers of the other comb-shaped electrode. According to this configuration, the ladder acoustic wave filter device can be reduced in size.

In yet still another specific aspect of the ladder acoustic wave filter device according to a preferred embodiment of the present invention, the ladder acoustic wave filter device is a ladder surface acoustic wave filter device using a surface acoustic wave.

In a yet still different specific aspect of the ladder acoustic wave filter device according to a preferred embodiment of the present invention, the surface acoustic wave is a leaky surface acoustic wave. According to this configuration, the insertion loss reduction effect becomes greater.

A branching filter according to yet another preferred embodiment of the present invention includes the ladder acoustic wave filter device according to a preferred embodiment of the present invention mentioned above.

According to various preferred embodiments of the present invention, apodization weighting is applied to the series-arm-side IDT electrode. The busbars of the series-arm-side IDT electrode are configured so that in an acoustic wave propagation direction, the distance between the busbars in the overlap width direction perpendicular to the acoustic wave propagation direction becomes shorter as the overlap width of electrode fingers becomes smaller. Each of the pair of comb-shaped electrodes of the parallel-arm-side IDT electrode further includes a plurality of dummy electrodes that extend from the busbar, and are opposed to the electrode fingers of the other comb-shaped electrode in the overlap width direction. The parallel-arm-side IDT electrode is a normal IDT electrode in which the overlap width is constant. Therefore, ripples in the pass band can be effectively suppressed, and insertion loss can be significantly reduced in both of the low frequency side portion and high frequency side portion of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with regard to a branching filter 1 as a duplexer shown in FIG. 1. More specifically, the branching filter 1 according to the present preferred embodiment is a duplexer that preferably supports the UTMS-BAND 8 standard with a transmit frequency band of 880 MHz to 915 MHz and a receive frequency band of 925 MHz to 960 MHz, for example. However, the branching filter according to the present invention is not limited to a duplexer. The branching filter according to the present invention may be, for example, a triplexer. Also, the branching filter according to the present invention may be either of a branching filter using surface acoustic waves, and a branching filter using boundary acoustic waves. In this case, an example of the branching filter 1 using surface acoustic waves will be described.

Figure 1:
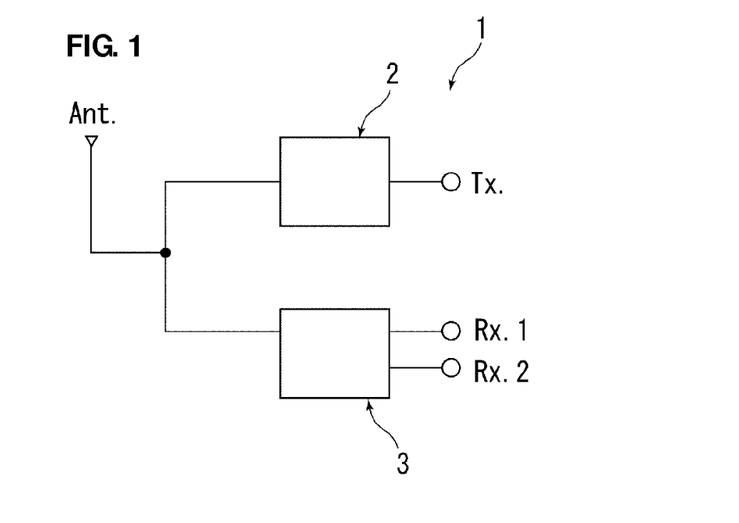
FIG. 1 is a schematic equivalent circuit diagram of a branching filter according to a preferred embodiment of the present invention.

As shown in FIG. 1, the branching filter 1 includes a transmitting filter device 2 and a receiving filter device 3. The receiving filter device 3 is a so-called balanced filter device having a balanced-unbalanced transforming function. The receiving filter device 3 is connected between an antenna terminal Ant., and first and second receiving-side signal terminals Rx. 1, Rx. 2. The receiving filter device 3 can be configured by, for example, an acoustic wave filter device using acoustic waves such as surface acoustic waves or boundary acoustic waves. More specifically, the receiving filter device 3 can be configured by, for example, a longitudinally coupled resonator-type acoustic wave filter device.

The transmitting filter device 2 is a ladder acoustic wave filter device. Specifically, the transmitting filter device 2 is a ladder surface acoustic wave filter device using surface acoustic waves. More specifically, the transmitting filter device 2 is a ladder leaky surface acoustic wave filter device using leaky surface acoustic wave.

Figure 2:
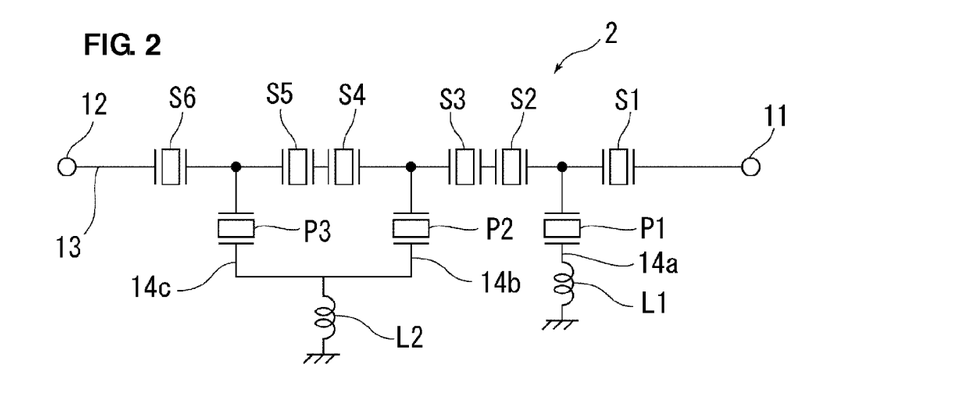
FIG. 2 is an equivalent circuit diagram of a transmitting filter device according to a preferred embodiment of the present invention.

The transmitting filter device 2 is connected between an antenna terminal Ant., and a transmitting-side signal terminal Tx. FIG. 2 shows an equivalent circuit diagram of the transmitting filter device 2.

As shown in FIG. 2, the transmitting filter device 2 includes an input end 11 connected to the transmitting-side signal terminal Tx, and an output terminal 12 connected to the antenna terminal Ant. The input end 11 and the output end 12 are electrically connected by a series arm 13. The series arm 13 is provided with a plurality of series arm resonators S1 to S6. That is, the plurality of series arm resonators S1 to S6 are connected in series between the input end 11 and the output end 12 so as to define the series arm 13. Each of the plurality of series arm resonators S1 to S6 is configured by a series-arm-side IDT electrode.

A plurality of parallel arms 14a to 14c are electrically connected between the series arm 13 and a ground potential. Specifically, the plurality of parallel arms 14a to 14c are each electrically connected between the portion of the series arm 13 located between adjacent ones of the series arm resonators S1 to S6, and the ground potential. The plurality of parallel arms 14a to 14c are respectively provided with parallel arm resonators P1 to P3. Each of the parallel arm resonators P1 to P3 is configured by at least one parallel-arm-side IDT electrode. Specifically, in this preferred embodiment, each of the parallel arm resonators P1 to P3 is configured by one single parallel-arm-side IDT electrode.

In the parallel arm 14a, a first inductor L1 is arranged so as to be connected in series with the parallel arm resonator P1. On the other hand, an inductor L2 is electrically connected between the junction point of the parallel arm 14b and the parallel arm 14c, and the ground potential.

Figure 3:
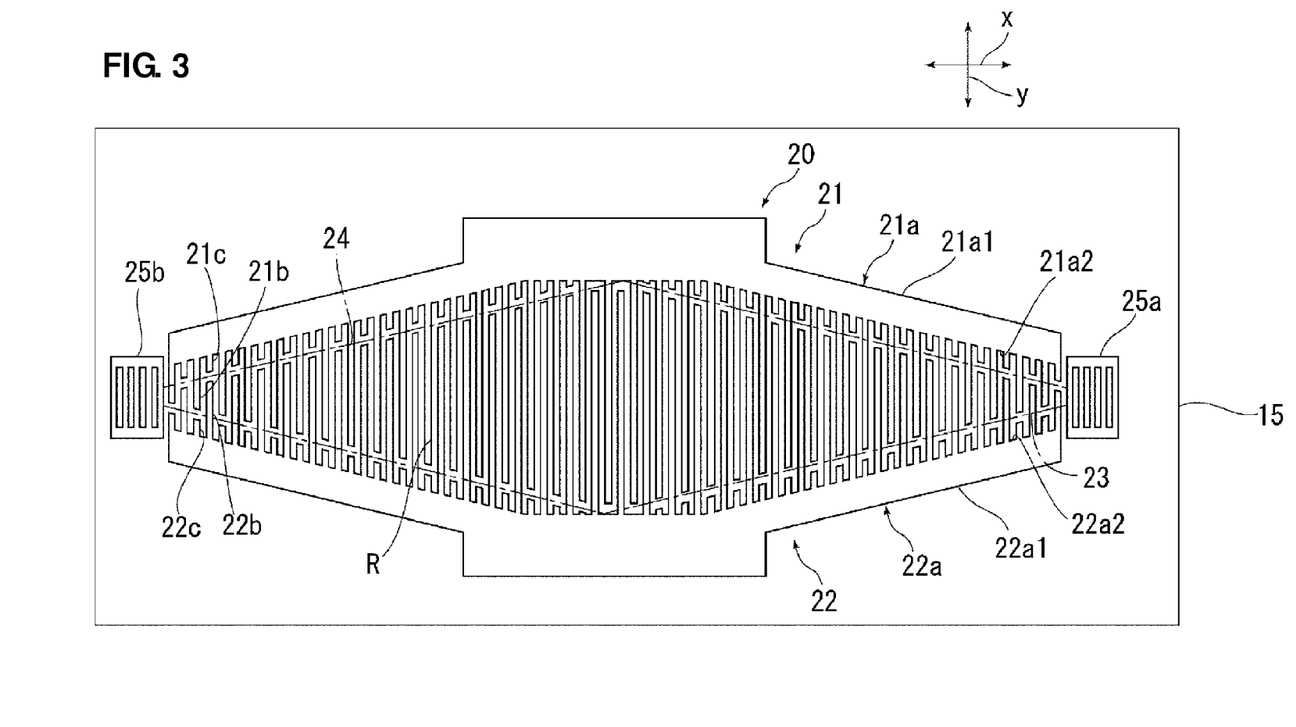
FIG. 3 is a schematic plan view of a series-arm-side IDT electrode according to a preferred embodiment of the present invention.

In the present preferred embodiment, the series arm resonators S1 to S6 are each configured by a series-arm-side IDT electrode 20 schematically shown in FIG. 3. As shown in FIG. 3, the series-arm-side IDT electrode 20 is provided on a piezoelectric substrate 15. On the piezoelectric substrate 15, a pair of reflectors 25a, 25b are arranged on both sides in an acoustic wave propagation direction x of the series-arm-side IDT electrode 20. The piezoelectric substrate 15 is not particularly limited, and can be configured by, for example, a LiNbO$_3$ substrate, a LiTaO$_3$ substrate, or a quartz substrate.

The series-arm-side IDT electrode 20 includes a pair of comb-shaped electrodes 21, 22 that are interposed between each other. Each of the comb-shaped electrodes 21, 22 includes a busbar 21a, 22a, a plurality of electrode fingers 21b, 22b, and a plurality of dummy electrodes 21c, 22c. The busbar 21a, 22a has a first edge 21a1, 22a1 located on the outer side in an overlap width direction y perpendicular to the acoustic wave propagation direction x, and a second edge 21a2, 22a2 located on the inner side in the overlap width direction y and opposed to the other busbar 21a, 22a. The plurality of electrode fingers 21b, 22b extend toward the other busbar 21a, 22a along the overlap width direction y from the second edge 21a2, 22a2 located on the inner side in the overlap width direction y. The plurality of dummy electrodes 21c, 22c extend along the overlap width direction y from the busbar 21a, 22a, and are opposed to the electrode fingers 21b, 22b of the other comb-shaped electrode 21, 22 in the overlap width direction y.

Apodization weighting is applied to the series-arm-side IDT electrode 20. That is, in the series-arm-side IDT electrode 20, the overlapping width of the adjacent electrode fingers 21b, 22b in the overlap width direction y is varied with respect to the acoustic wave propagation direction x. In this preferred embodiment, the comb-shaped electrode 21, 22 is arranged such that each of first and second envelopes 23, 24, which are imaginary lines formed by connecting the tips of the electrode fingers 21b and 22b, extends closer to the other busbar 21a, 22a with increasing distance outwards in the acoustic wave propagation direction x. For this reason, in the series-arm-side IDT electrode 20, the overlap width decreases monotonously from the middle toward the outer side in the acoustic wave propagation direction x of the series-arm-side IDT electrode 20. In other words, the series-arm-side IDT electrode 20 is arranged such that the overlap width has a local maximum in its middle in the acoustic wave propagation direction x. In the present preferred embodiment, the shape of a region R bounded by the first and second envelopes 23, 24 is rhombic.

In the present preferred embodiment, in the busbar 21a, 22a of the series-arm-side IDT electrode 20, at least a portion of the second edge 21a2, 22a2 extends in a direction inclined with respect to the acoustic wave propagation direction x. For this reason, in the present preferred embodiment, in the acoustic wave propagation direction x, the distance in the overlap width direction y between the busbars 21a, 22a becomes shorter as the overlap width of the electrode fingers 21b, 22b becomes smaller. Therefore, the length of the dummy electrodes 21c, 22c along the overlap width direction y is short even in portions where the overlap width of the electrode fingers 21b, 22b is small.

Figure 4:
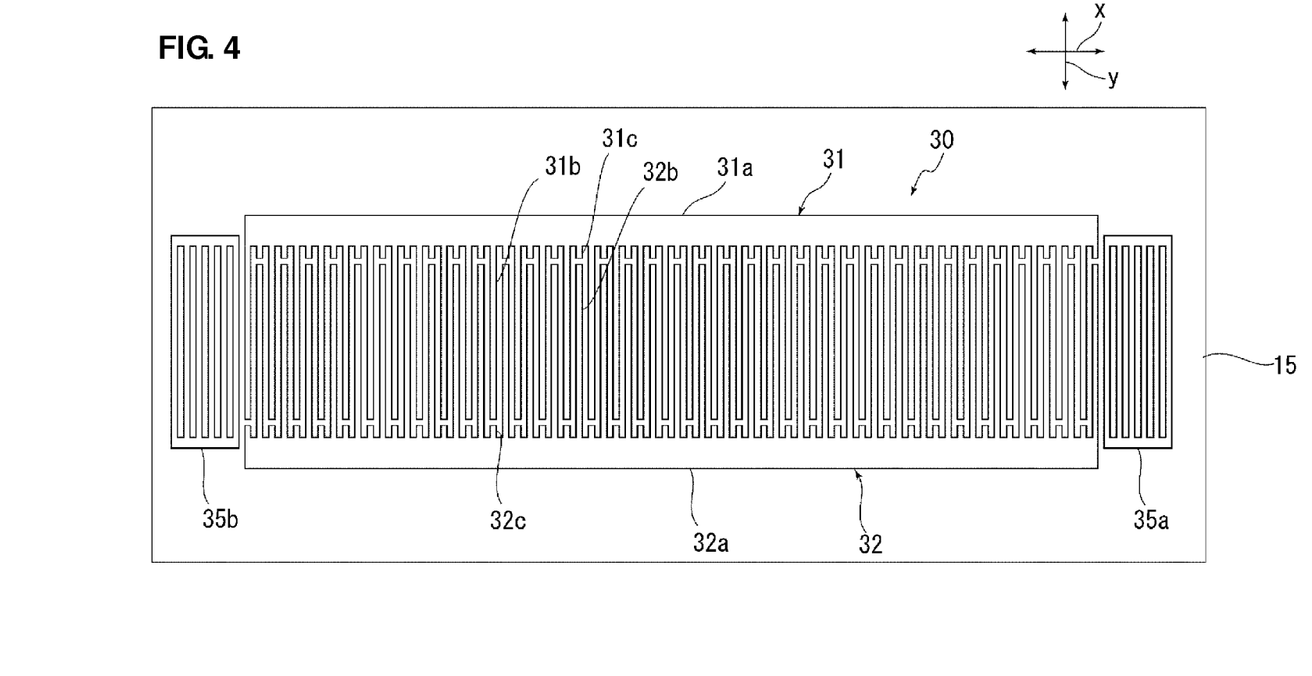
FIG. 4 is a schematic plan view of a parallel-arm-side IDT electrode according to a preferred embodiment of the present invention.

In the present preferred embodiment, the parallel arm resonators P1 to P3 are each configured by a parallel-arm-side IDT electrode 30 schematically shown in FIG. 4. As shown in FIG. 4, like the series-arm-side IDT electrode 20, the parallel-arm-side IDT electrode 30 is also provided on the piezoelectric substrate 15. On the piezoelectric substrate 15, a pair of reflectors 35a, 35b are arranged on both sides in the acoustic wave propagation direction x of the parallel-arm-side IDT electrode 30.

The parallel-arm-side IDT electrode 30 includes a pair of comb-shaped electrodes 31, 32 that are interposed between each other. Each of the comb-shaped electrodes 31, 32 includes a busbar 31a, 32a, a plurality of electrode fingers 31b, 32b, and a plurality of dummy electrodes 31c, 32c. The plurality of electrode fingers 31b, 32b extend from the busbar 31a, 32a toward the other busbar 31a, 32a along the overlap width direction y. In this preferred embodiment, the parallel-arm-side IDT electrode 30 is a normal IDT electrode in which the overlap width of the electrode fingers 31b, 32b is constant in the acoustic wave propagation direction x. The plurality of dummy electrodes 31c, 32c extend from the busbar 31a, 32a along the overlap width direction y, and are opposed to the electrode fingers 31b, 32b of the other comb-shaped electrode 31, 32 in the overlap width direction y. Since the parallel-arm-side IDT electrode 30 includes the dummy electrodes 31c, 32c in this preferred embodiment as described above, the aperture length that is the distance between the busbars 31a, 32a of the parallel-arm-side IDT electrode 30 is larger than the overlap width.

As described above, in this preferred embodiment, apodization weighting is applied to the series-arm-side IDT electrode 20, and the series-arm-side IDT electrode 20 is configured so that in the acoustic wave propagation direction x, the distance in the overlap width direction y between the busbars 21a, 22a becomes shorter as the overlap width of the electrode fingers 21b, 22b becomes smaller. For this reason, ripples in the pass band can be effectively suppressed while reducing insertion loss in the high frequency side portion of the pass band of the transmitting filter device 2. Hereinbelow, a description will be given of this effect by way of specific examples. It should be noted that for the convenience of description, in the following description of Comparative Examples, Experimental Examples, etc. as well, description of components having substantially the same functions as those of the above-mentioned preferred embodiment is sometimes omitted by denoting these components by the same symbols.

First, as an Example of a preferred embodiment of the present invention, the transmitting filter device 2 according to the above-mentioned preferred embodiment was prepared according to the design parameters mentioned below. The insertion loss characteristics of the transmitting filter device according to Example are indicated by a solid line in FIG. 5.

Design Parameters in the Example

Piezoelectric substrate: 42° Rotated Y-cut X-propagation LiTaO$_3$ substrate

Film structure of the IDT electrode: Al film of 400 nm in thickness

Electrode finger pitch in the serial-arm-side IDT electrode: S1: 4.27 µm, S2: 4.24 µm, S3: 4.28 µm, S4: 4.33 µm, S5: 4.33 µm, S6: 4.27 µm Duty in the serial-arm-side IDT electrode: 0.5

Ratio of apodization weighting in the serial-arm-side IDT electrode: 80%

Maximum overlap width in the serial-arm-side IDT electrode: S1: 110 µm, S2: 90 µm, S3: 100 µm, S4: 120 µm, S5: 80 µm, S6: 110 µm Maximum aperture length in the serial-arm-side IDT electrode: S1: 111 μm, S2: 91 μm, S3: 101 μm, S4: 121 μm, S5: 81 μm, S6: 111 μm Electrode finger pitch in the parallel-arm-side IDT electrode: P1: 4.47 μm, P2: 4.45 μm, P3: 4.47 μm Duty in the parallel-arm-side IDT electrode: 0.5

Overlap width in the parallel-arm-side IDT electrode: P1: 90 μm, P2: 90 μm, P3: 80 μm Aperture length in the parallel-arm-side IDT electrode: P1: 96 μm, P2: 96 μm, P3: 86 μm In Comparative Example 1, as shown in FIG. 6, a transmitting filter device having the same configuration as that of the Example mentioned above was prepared, except that the series-arm-side IDT electrode 20 has the busbars 21a, 22a that extend parallel to the acoustic wave propagation direction x. The insertion loss characteristics of the transmitting filter device according to Comparative Example 1 are indicated by a dotted line in FIG. 5.

Figure 7:
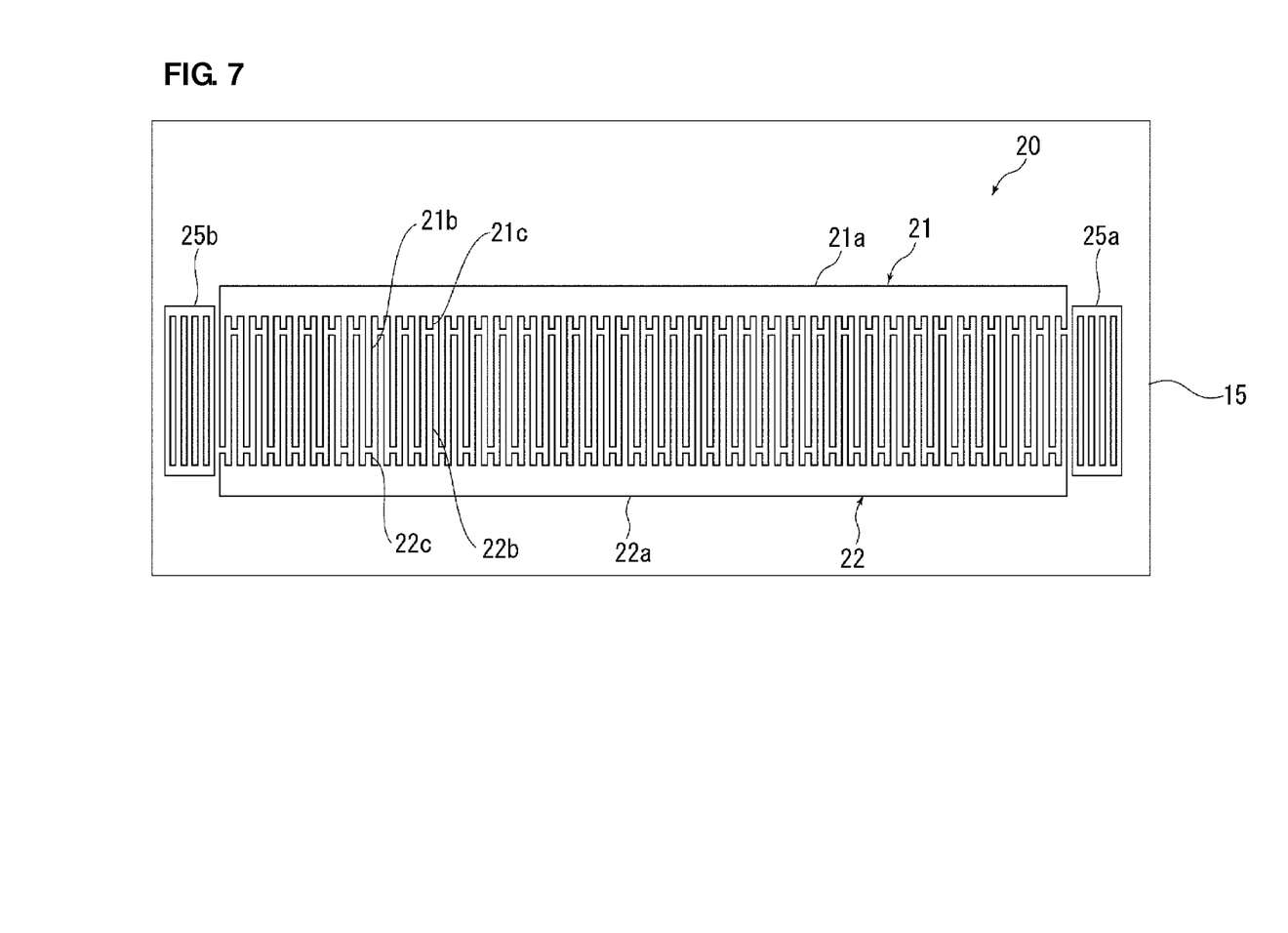
FIG. 7 is a schematic plan view of a series-arm-side IDT electrode according to Comparative Example 2.

In Comparative Example 2, as shown in FIG. 7, a transmitting filter device having the same configuration as that of the Example mentioned above was prepared, except that apodization weighting is not applied to the series-arm-side IDT electrode 20. The insertion loss characteristics of the transmitting filter device according to Comparative Example 2 are indicated by an alternate long and short dash line in FIG. 5. It should be noted, however, that in Comparative Example 2, the overlap width in the series-arm-side IDT electrode was set as follows: S1: 67 μm, S2: 54 μm, S3: 59 μm, S4: 72 μm, S5: 50 μm, S6: 67 μm, and the aperture length was set as follows: S1: 73 μm, S2: 60 μm, S3: 65 μm, S4: 78 μm, S5: 56 μm, S6: 73 μm.

Table 1 below shows insertion loss in the high frequency side portion (915 MHz) of the pass band in each of Example and Comparative Examples 1, 2 mentioned above, and ripple deviation in the band of a channel located in the middle of the pass band (band width: about 3.84 MHz, for example). It should be noted that "ripple deviation" refers to the difference between the maximum and minimum values of insertion loss in a predetermined band, and a smaller value indicates that the insertion loss characteristics are more flat. That is, "ripple deviation" represents data serving as an index of the flatness of insertion loss characteristics.

TABLE 1

|  | Insertion loss at 915 MHz | Ripple deviation in middle of pass band |
| --- | --- | --- |
| Example 1 | 2.65 dB | 0.18 dB |
| Comparative Example 1 | 2.70 dB | 0.44 dB |
| Comparative Example 2 | 3.00 dB | 0.30 dB |

Figure 5:
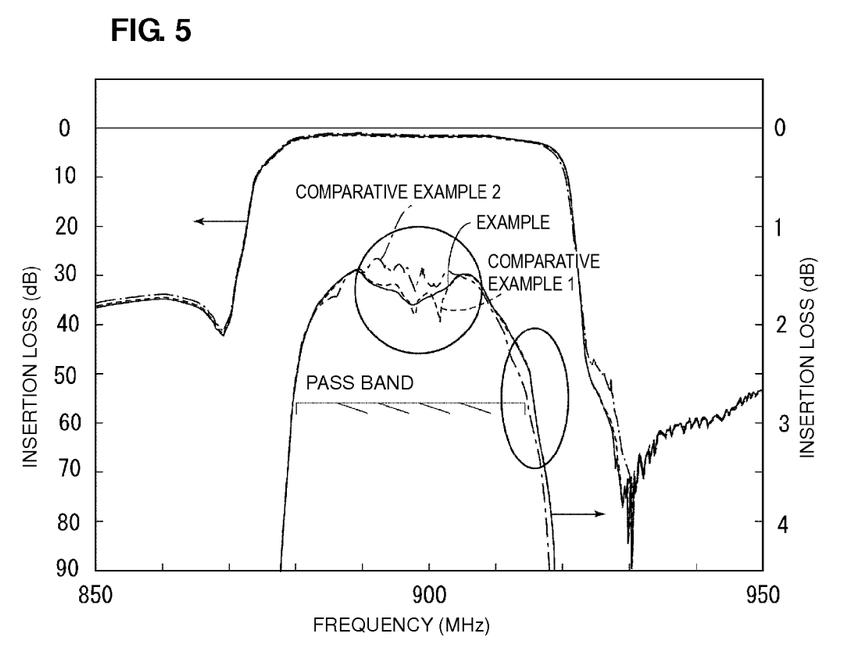
FIG. 5 is a graph representing the insertion loss characteristics of a transmitting filter device in each of an Example of a preferred embodiment of the present invention and Comparative Examples 1, 2.
Figure 6:
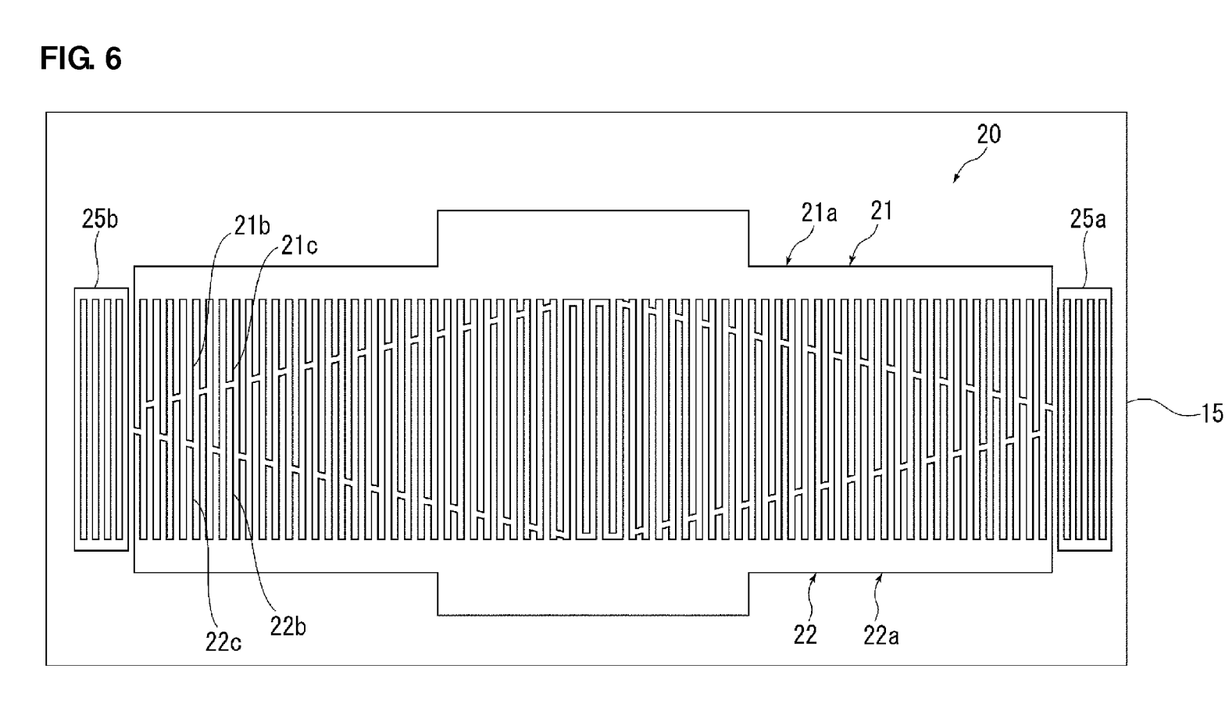
FIG. 6 is a schematic plan view of a series-arm-side IDT electrode according to Comparative Example 1.

As is apparent from the results shown in Table 1 above and FIG. 5, although insertion loss in the high frequency side portion of the pass band can be reduced further in Comparative Example 1 in which apodization weighting is applied to the series-arm-side IDT electrode 20 than in Comparative Example 2 in which the series-arm-side IDT electrode 20 is configured by a normal IDT electrode, ripples occur in the pass band, and flatness of the insertion loss characteristic in the pass band deteriorates.

In contrast, in the case of the Example in which apodization weighting is applied to the series-arm-side IDT electrode 20, and which is configured so that in the acoustic wave propagation direction x, the distance in the overlap width direction y between the busbars 21a, 22a becomes shorter as the overlap width of the electrode fingers 21b, 22b becomes smaller, insertion loss in the high frequency side portion of the pass band was further reduced than in Comparative Example 1. Also, it was possible to suppress ripples in the pass band effectively, and the flatness of insertion loss characteristics in the pass band was further enhanced than in Comparative Example 2. From this result, it can be appreciated that by applying apodization weighting to the series-arm-side IDT electrode 20, and making the distance in the overlap width direction y between the busbars 21a, 22a shorter as the overlap width of the electrode fingers 21b, 22b becomes smaller in the acoustic wave propagation direction x, ripples in the pass band can be effectively suppressed, and also insertion loss in the high frequency side portion of the pass band can be reduced.

The reason why ripples in the pass band can be effectively suppressed by making the distance in the overlap width direction y between the busbars 21a, 22a shorter as the overlap width of the electrode fingers 21b, 22b becomes smaller is because the dummy electrodes become shorter. As the dummy electrodes become shorter, the reflection coefficient of the dummy electrodes becomes smaller. Thus, energy confinement efficiency of higher-order mode or spurious of the surface acoustic wave decreases, and ripples resulting from these factors are suppressed.

Also, by making the distance in the overlap width direction y between the busbars 21a, 22a shorter as the overlap width of the electrode fingers 21b, 22b becomes smaller in the acoustic wave propagation direction x, the area of the busbar 21a, 22a can be enlarged. This allows for improved heat dissipation from the busbar 21a, 22a. In actuality, when the ambient temperature was set at 55° C., and an electric power of 0.8 W was applied, the maximum temperature of the transmitting filter device 2 in Comparative Example 1 was 101° C., and the maximum temperature in the Example was 97° C., for example. Thus, migration of the electrode material from the IDT electrode can be effectively suppressed. Therefore, the electric power handling capacity of the transmitting filter device 2 can be enhanced.

Next, the influence of the parallel-arm-side IDT electrode 30 on filter characteristics was evaluated by way of Reference Examples 1 to 3.

In Reference Examples 1 to 3, the series-arm-side IDT electrode 20 was configured as the one shown in FIG. 6 used in Comparative Example 1. That is, the series-arm-side IDT electrode 20 that is apodization-weighted but has parallel busbars was adopted.

With regard to the parallel-arm-side IDT electrode 30, in Reference Example 1, the one shown in FIG. 4 used in the Example mentioned above was used. That is, in Reference Example 1, the parallel-arm-side IDT electrode 30 is configured by a normal IDT electrode having dummy electrodes. In Reference Example 1, the aperture length of the parallel-arm-side IDT electrode 30 was as follows: P1: 96 μm, P2: 96 μm, P3: 86 μm, and the overlap width was as follows: P1: 90 μm, P2: 90 μm, P3: 80 μm. The length of the dummy electrodes was 2.5 μm.

Figure 8:
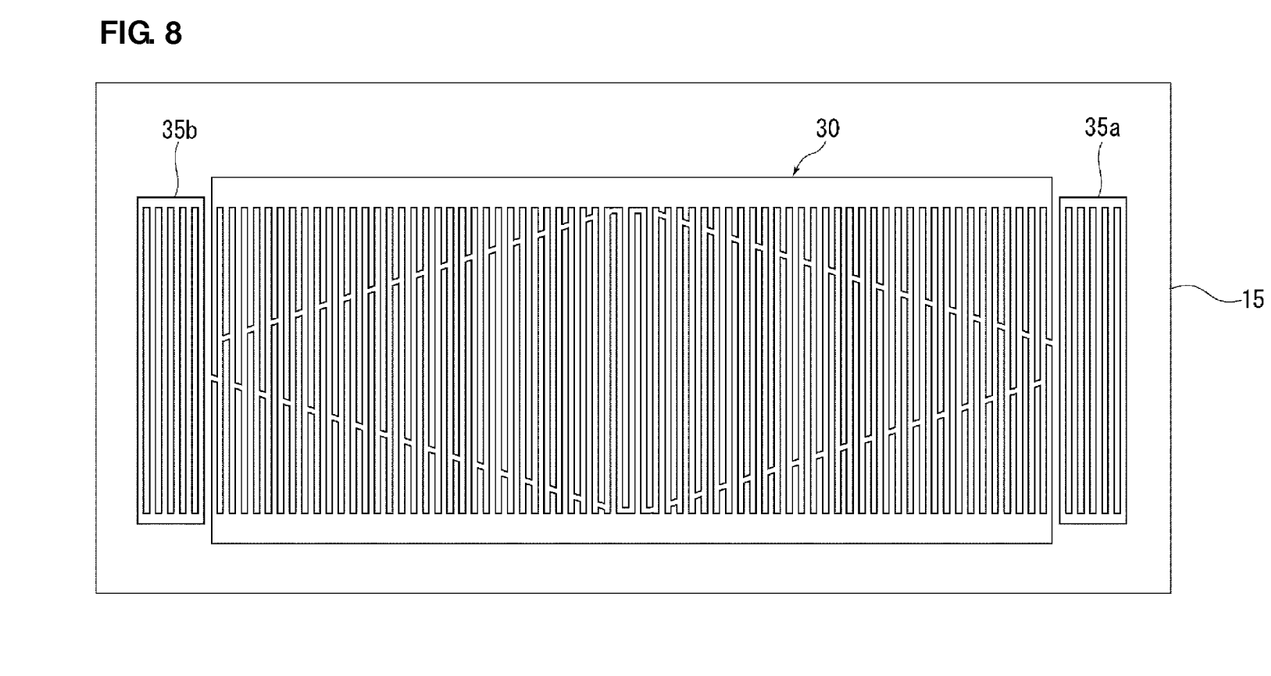
FIG. 8 is a schematic plan view of a parallel-arm-side IDT electrode according to Reference Example 2.

Reference Example 2 was configured in the same manner as Reference Example 1, except that the parallel-arm-side IDT electrode 30 is apodization-weighted and includes parallel busbars as shown in FIG. 8. It should be note that in Reference Example 2, the aperture length of the parallel-arm-side IDT electrode 30 was as follows: P1: 151 μm, P2: 151 μm, P3: 134 μm, and the maximum overlap width was as follows: P1: 150 μm, P2: 150 μm, P3: 133 μm. The ratio of apodization weighting in the parallel-arm-side IDT electrode 30 was 80%.

Figure 9:
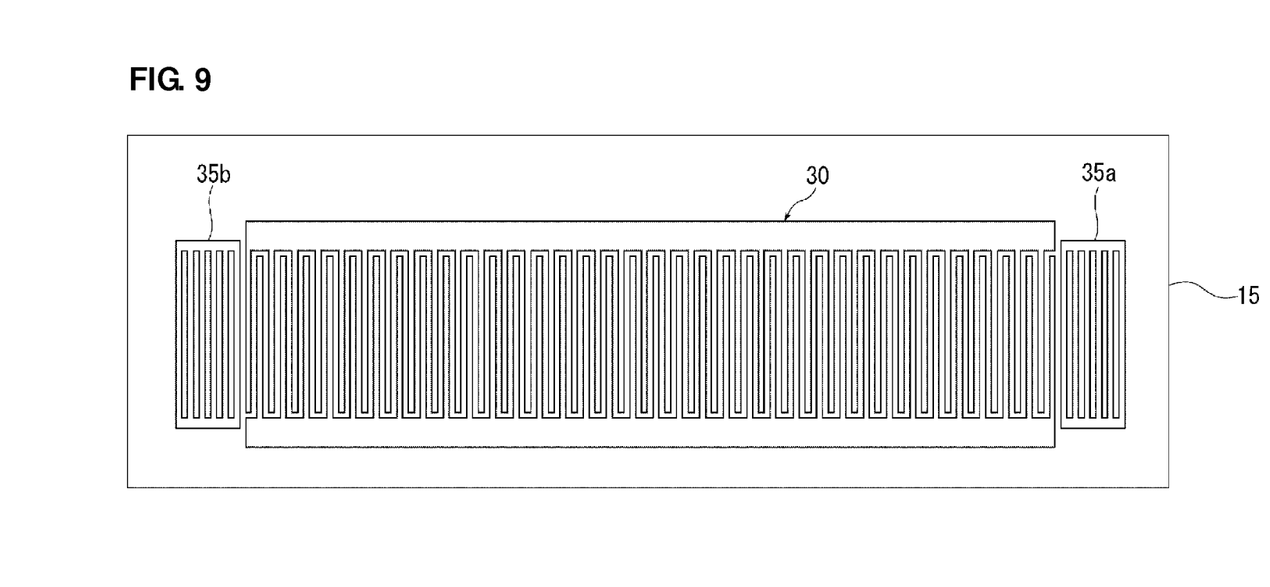
FIG. 9 is a schematic plan view of a parallel-arm-side IDT electrode according to Reference Example 3.

Reference Example 3 was configured in the same manner as Reference Example 1, except that the parallel-arm-side IDT electrode 30 is of a normal type with no dummy electrodes as shown in FIG. 9. It should be note that in Reference Example 3, the aperture length of the parallel-arm-side IDT electrode 30 was as follows: P1: 91 μm, P2: 91 μm, P3: 81 μm, and the maximum overlap width was as follows: P1: 90 μm, P2: 90 μm, P3: 80 μm.

Figure 10:
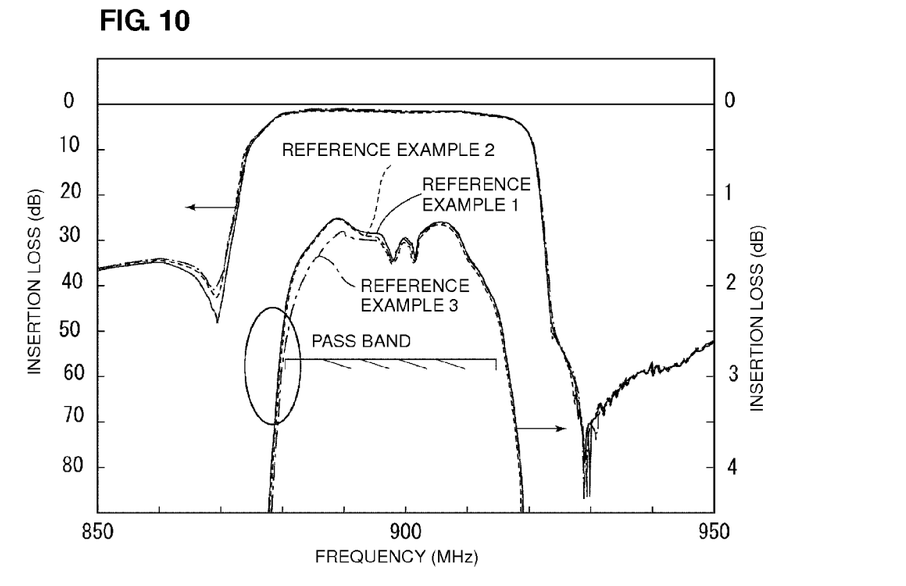
FIG. 10 is a graph representing the insertion loss characteristics of a transmitting filter device in each of Reference Examples 1 to 3.

The insertion loss characteristics of the transmitting filter device in each of Reference Examples 1 to 3 are shown in FIG. 10. Also, insertion loss in the low frequency side portion (880 MHz) of the pass band in each of Reference Examples 1 to 3 is shown in Table 2 below.

TABLE 2

|  | Insertion loss at 880 MHz |
| --- | --- |
| Reference Example 1 | 2.49 dB |
| Reference Example 2 | 2.49 dB |
| Reference Example 3 | 2.61 dB |

As is apparent from Table 2 above and FIG. 10, insertion loss in the low frequency side portion of the pass band was smaller in Reference Example 2 in which the parallel-arm-side IDT electrode 30 is configured by an apodization-weighted IDT electrode, than in Reference Example 3 in which the parallel-arm-side IDT electrode 30 is configured by a normal IDT electrode. From this result, it can be appreciated that applying apodization weighting to the parallel-arm-side IDT electrode 30 is effective in making insertion loss in the low frequency side portion of the pass band small. However, if apodization weighting is applied, for example, the aperture length of the parallel-arm-side IDT electrode 30 in the parallel arm resonator P1 increases as much as by approximately 60%, from 91 μm to 150 μm, for example. For this reason, the size of the parallel-arm-side IDT electrode 30, and by extension, the transmitting filter device tends to increase.

In contrast, in Reference Example 1 in which the parallel-arm-side IDT electrode 30 is configured by a normal IDT electrode having dummy electrodes, despite the relatively small aperture length of 96 μm in the parallel arm resonator P1, for example, insertion loss in the low frequency side portion of the pass band was small. From this result, it can be appreciated that by configuring the parallel-arm-side IDT electrode 30 by a normal IDT electrode having dummy electrodes, insertion loss in the low frequency side portion of the pass band can be effectively reduced without causing an increase in the size of the parallel-arm-side IDT electrode 30.

While the above-mentioned effect can be generally obtained if the transmitting filter device 2 is of a type that uses acoustic waves, the transmitting filter device 2 is preferably of a type that uses surface acoustic waves, particularly a type that uses a LiTaO$_3$ substrate as a piezoelectric substrate and uses leaky surface acoustic waves. For example, although many ripples due to a higher-order transverse mode occur when a LiNbO$_3$ substrate is used, the occurrence of ripples can be relatively suppressed by use of a LiTaO$_3$ substrate. Thus, if a LiTaO$_3$ substrate is used, there is no need to apply apodization weighting also to the parallel-arm-side IDT electrode 30 as an anti-ripple measure, nor is there any increase in size. Also, in the case of Reference Example 3 in which the parallel-arm-side IDT electrode 30 is configured by a normal IDT electrode, energy concentration due to the transverse mode occurs in the gap between the tip of the electrode finger and the busbar, causing insertion loss. In the case of using leaky surface acoustic wave, a SSBW (Surface Skimming Bulk Wave) occurs in the gap between the tip of the electrode finger and the busbar, which further makes insertion loss larger. Since both of these causes can be suppressed by providing dummy electrodes in a normal IDT electrode, the insertion loss reduction effect becomes particularly great for cases where leaky surface acoustic waves are used.

The above-mentioned preferred embodiment is preferably directed to the case in which all of the series-arm-side IDT electrodes 20 are configured by apodization-weighted IDT electrodes in which the distance in the overlap width direction y between the busbars 21a, 22a becomes shorter as the overlap width of the electrode fingers 21b, 22b becomes smaller in the acoustic wave propagation direction x, for example. However, the present invention is not limited to this configuration. In the present invention, it suffices that at least one series-arm-side IDT electrode be configured by an apodization-weighted IDT electrode in which the distance in the overlap width direction y between the busbars 21a, 22a becomes shorter as the overlap width of the electrode fingers 21b, 22b becomes smaller in the acoustic wave propagation direction x. In the case where some of series-arm-side IDT electrodes are to be configured by an apodization-weighted IDT electrode in which the distance in the overlap width direction y between the busbars 21a, 22a becomes shorter as the overlap width of the electrode fingers 21b, 22b becomes smaller in the acoustic wave propagation direction x, it is preferable that a series-arm-side IDT electrode defining the series arm resonator having the lowest resonant frequency and required to have the highest electric power handling capacity be configured by an apodization-weighted IDT electrode in which the distance in the overlap width direction y between the busbars 21a, 22a becomes shorter as the overlap width of the electrode fingers 21b, 22b becomes smaller in the acoustic wave propagation direction x.

Likewise, while the effects and advantages of the present invention can be attained if at least one parallel-arm-side IDT electrode is a normal IDT electrode having dummy electrodes, the effects and advantages become greater if all of the parallel-arm-side IDT electrodes are configured as normal IDT electrodes having dummy electrodes.

Figure 11:
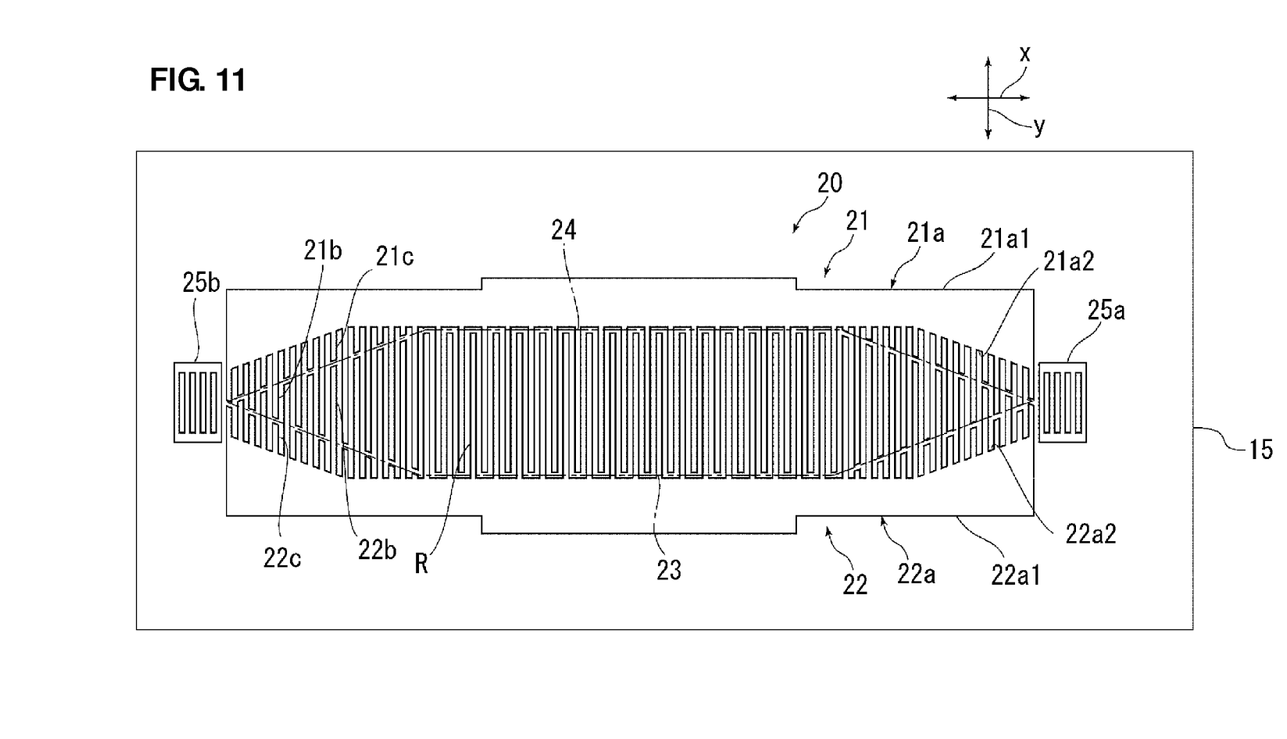
FIG. 11 is a schematic plan view of a series-arm-side IDT electrode according to a modification.

The above-mentioned preferred embodiment is preferably directed to the case in which the region R bounded by the first and second envelopes 23, 24 of the series-arm-side IDT electrode has a rhombic shape, for example. However, the present invention is not limited to this configuration. For example, as shown in FIG. 11, the region R bounded by the first and second envelopes 23, 24 of the series-arm-side IDT electrode 20 may have a hexagonal shape. This enables a further reduction in the size of the series-arm-side IDT electrode 20. In addition, insertion loss characteristics equivalent to those in the case where the region R has a rhombic shape can be obtained even in the case where the region R has a hexagonal shape. This will be described in more detail below on the basis of Experimental Examples 1, 2.

In Experimental Example 1, a 1-port resonator configured by the series-arm-side IDT electrode 20 used in the above-mentioned preferred embodiment shown in FIG. 3 in which the region R has a rhombic shape was fabricated, and return loss was measured. On the other hand, in Experimental Example 2, a 1-port resonator configured by the series-arm-side IDT electrode 20 shown in FIG. 11 in which the region R has a hexagonal shape was fabricated, and return loss was measured. It should be noted that in Experimental Examples 1, 2, the number of pairs was set as 90. The aperture length was set as 97 μm in Experimental Example 1, and 70 μm in Experimental Example 2.

Figure 12:
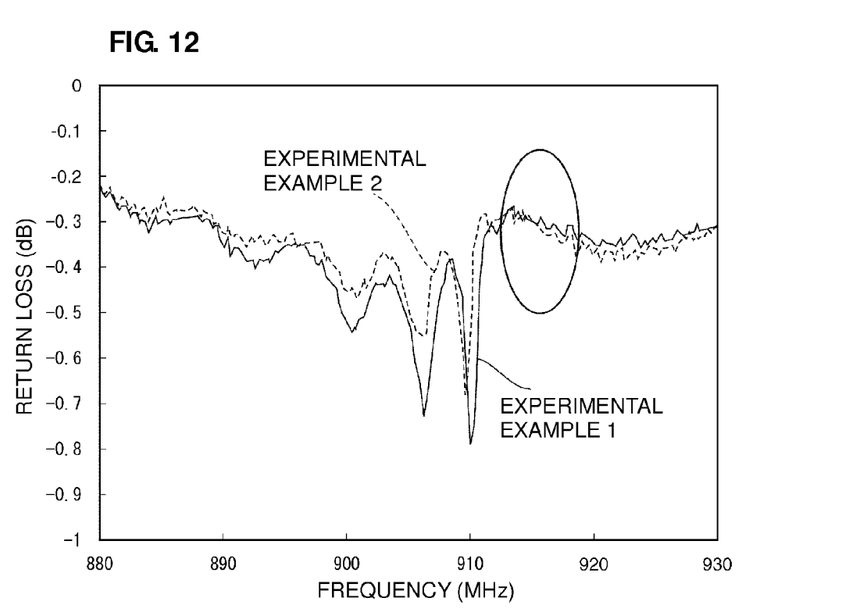
FIG. 12 is a graph representing the return loss of a 1-port resonator in each of Experimental Examples 1, 2.

FIG. 12 shows the return loss of the 1-port resonator in each of Experimental Examples 1, 2. As shown in FIG. 12, Experimental Examples 1, 2 exhibited equivalent return loss at 915

MHz on the high frequency side of the pass band. From this result, it can be appreciated that insertion loss in the high frequency side portion of the pass band of the transmitting filter device does not vary very much irrespective of whether the region R has a rhombic shape or hexagonal shape. On the other hand, the aperture length can be made smaller by forming the region R in a hexagonal shape than by forming the region R in a rhombic shape. Therefore, by forming the region R in a hexagonal shape, a further reduction in size can be achieved while suppressing deterioration of insertion loss characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder acoustic wave filter device comprising:
an input end;
an output end;
a series arm that electrically connects the input end and the output end;
a series arm resonator provided to the series arm and including a series-arm-side IDT electrode;
a parallel arm electrically connected between the series arm and a ground potential; and
a parallel arm resonator provided to the parallel arm and including a parallel-arm-side IDT electrode; wherein
each of the series-arm-side IDT electrode and the parallel-arm-side IDT electrode includes a pair of comb-shaped electrodes that are interposed between each other, the pair of comb-shaped electrodes each including a busbar and a plurality of electrode fingers extending from the busbar;
the series-arm-side IDT electrode is apodization weighted, and the busbars of the series-arm-side IDT electrode are configured so that in an acoustic wave propagation direction, a distance between the busbars in an overlap width direction perpendicular to the acoustic wave propagation direction becomes shorter as an overlap width of the electrode fingers becomes smaller;
each of the pair of comb-shaped electrodes of the parallel-arm-side IDT electrode further includes a plurality of dummy electrodes that extends from the busbar and are opposed to the electrode fingers of the other comb-shaped electrode in the overlap width direction, and the parallel-arm-side IDT electrode is an IDT electrode in which the overlap width is constant; and
a region bounded by a first envelope and a second envelope has a hexagonal shape, the first envelope being an imaginary line formed by connecting tips of the electrode fingers of one of the pair of comb-shaped electrodes of the series-arm-side IDT electrode, the second envelope being an imaginary line formed by connecting tips of the electrode fingers of the other one of the pair of comb-shaped electrodes of the series-arm-side IDT electrode.

2. The ladder acoustic filter device according to claim 1, wherein in each one of the busbar of each of the pair of comb-shaped electrodes of the series-arm-side IDT electrode, at least a portion of an edge of the busbar of one of the pair of comb-shaped electrodes, which is opposed to the other busbar of one of the pair of comb-shaped electrodes, extends in a direction inclined with respect to the acoustic wave propagation direction.

3. The ladder acoustic wave filter device according to claim 2, wherein:
the ladder acoustic wave filter device includes a plurality of the parallel arm resonators; and
in all of the plurality of parallel arm resonators, each of the pair of comb-shaped electrodes of the parallel-arm-side IDT electrode includes the busbar, the plurality of electrode fingers, and the plurality of dummy electrodes.

4. The ladder acoustic wave filter device according to claim 2, wherein a region bounded by a first envelope and a second envelope has a hexagonal shape, the first envelope being an imaginary line formed by connecting tips of the electrode fingers of one of the pair of comb-shaped electrodes of the series-arm-side IDT electrode, the second envelope being an imaginary line formed by connecting tips of the electrode fingers of the other comb-shaped electrode of the series-arm-side IDT electrode.

5. The ladder acoustic wave filter device according to claim 2, wherein:
the ladder acoustic wave filter device includes a plurality of the series arm resonators;
the series-arm-side IDT electrode is apodization weighted in at least a series arm resonator with a lowest resonant frequency among the plurality of series arm resonators, and the busbars of the pair of comb-shaped electrodes of the series-arm-side IDT electrode are configured so that in the acoustic wave propagation direction, the distance between the busbars in the overlap width direction perpendicular to the acoustic wave propagation direction becomes shorter as the overlap width of the electrode fingers becomes smaller.

6. The ladder acoustic wave filter device according to claim 5, wherein:
the ladder acoustic wave filter device includes a plurality of the parallel arm resonators; and
in all of the plurality of parallel arm resonators, each of the pair of comb-shaped electrodes of the parallel-arm-side IDT electrode includes the busbar, the plurality of electrode fingers, and the plurality of dummy electrodes.

7. The ladder acoustic wave filter device according to claim 5, wherein a region bounded by a first envelope and a second envelope has a hexagonal shape, the first envelope being an imaginary line formed by connecting tips of the electrode fingers of one of the pair of comb-shaped electrodes of the series-arm-side IDT electrode, the second envelope being an imaginary line formed by connecting tips of the electrode fingers of the other comb-shaped electrode of the series-arm-side IDT electrode.

8. The ladder acoustic wave filter device according to claim 5, wherein the series-arm-side IDT electrode apodization weighted in all of the plurality of series arm resonators, and the busbars of the pair of comb-shaped electrodes of the series-arm-side IDT electrode are configured so that in the acoustic wave propagation direction, the distance between the busbars in the overlap width direction perpendicular to the acoustic wave propagation direction becomes shorter as the overlap width of the electrode fingers becomes smaller.

9. The ladder acoustic wave filter device according to claim 8, wherein:
the ladder acoustic wave filter device includes a plurality of the parallel arm resonators; and
in all of the plurality of parallel arm resonators, each of the pair of comb-shaped electrodes of the parallel-arm-side IDT electrode includes the busbar, the plurality of electrode fingers, and the plurality of dummy electrodes.

10. The ladder acoustic wave filter device according to claim 1, wherein:
the ladder acoustic wave filter device includes a plurality of the series arm resonators;

the series-arm-side IDT electrode is apodization weighted in at least a series arm resonator with a lowest resonant frequency among the plurality of series arm resonators, and the busbars of the pair of comb-shaped electrodes of the series-arm-side IDT electrode are configured so that in the acoustic wave propagation direction, the distance between the busbars in the overlap width direction perpendicular to the acoustic wave propagation direction becomes shorter as the overlap width of the electrode fingers becomes smaller.

11. The ladder acoustic wave filter device according to claim 10, wherein:
the ladder acoustic wave filter device includes a plurality of the parallel arm resonators; and
in all of the plurality of parallel arm resonators, each of the pair of comb-shaped electrodes of the parallel-arm-side IDT electrode includes the busbar, the plurality of electrode fingers, and the plurality of dummy electrodes.

12. The ladder acoustic wave filter device according to claim 10, wherein a region bounded by a first envelope and a second envelope has a hexagonal shape, the first envelope being an imaginary line formed by connecting tips of the electrode fingers of one of the pair of comb-shaped electrodes of the series-arm-side IDT electrode, the second envelope being an imaginary line formed by connecting tips of the electrode fingers of the other comb-shaped electrode of the series-arm-side IDT electrode.

13. The ladder acoustic wave filter device according to claim 10, wherein the series-arm-side IDT electrode apodization weighted in all of the plurality of series arm resonators, and the busbars of the pair of comb-shaped electrodes of the series-arm-side IDT electrode are configured so that in the acoustic wave propagation direction, the distance between the busbars in the overlap width direction perpendicular to the acoustic wave propagation direction becomes shorter as the overlap width of the electrode fingers becomes smaller.

14. The ladder acoustic wave filter device according to claim 13, wherein:
the ladder acoustic wave filter device includes a plurality of the parallel arm resonators; and
in all of the plurality of parallel arm resonators, each of the pair of comb-shaped electrodes of the parallel-arm-side IDT electrode includes the busbar, the plurality of electrode fingers, and the plurality of dummy electrodes.

15. The ladder acoustic wave filter device according to claim 13, wherein a region bounded by a first envelope and a second envelope has a hexagonal shape, the first envelope being an imaginary line formed by connecting tips of the electrode fingers of one of the pair of comb-shaped electrodes of the series-arm-side IDT electrode, the second envelope being an imaginary line formed by connecting tips of the electrode fingers of the other comb-shaped electrode of the series-arm-side IDT electrode.

16. The ladder acoustic wave filter device according to claim 1, wherein:
the ladder acoustic wave filter device includes a plurality of the parallel arm resonators; and
in all of the plurality of parallel arm resonators, each of the pair of comb-shaped electrodes of the parallel-arm-side IDT electrode includes the busbar, the plurality of electrode fingers, and the plurality of dummy electrodes.

17. A branching filter comprising the ladder acoustic wave filter device according to claim 1 defining a transmitting filter device.

18. The ladder acoustic wave filter device according to claim 1, wherein the ladder acoustic wave filter device is a ladder surface acoustic wave filter device using a surface acoustic wave.

19. The ladder acoustic wave filter device according to claim 18, wherein the surface acoustic wave is a leaky surface acoustic wave.

* * * * *